(12) United States Patent
Sandhu

(10) Patent No.: US 9,044,089 B1
(45) Date of Patent: Jun. 2, 2015

(54) TRACK SHELVING SYSTEM WITH ADJUSTABLE SHELVES

(76) Inventor: Sukhbir S. Sandhu, Surrey (CA)

(*) Notice: Subject to any disclaimer, the term of this patent is extended or adjusted under 35 U.S.C. 154(b) by 298 days.

(21) Appl. No.: 13/412,153

(22) Filed: Mar. 5, 2012

(51) Int. Cl.
| A47G 7/00 | (2006.01) |
| A47B 88/04 | (2006.01) |
| H05K 7/18 | (2006.01) |

(52) U.S. Cl.
CPC .............. *A47B 88/044* (2013.01); *H05K 7/186* (2013.01)

(58) Field of Classification Search
CPC ............................... A47B 88/044; H05K 7/186
USPC ............. 40/312, 651; 108/105–108, 143; 211/90.02, 26, 187; 312/334.18, 312/334.19
See application file for complete search history.

(56) References Cited

U.S. PATENT DOCUMENTS

| 1,761,995 A * | 6/1930 | Siebe ............................. 40/651 |
| 3,099,501 A * | 7/1963 | Hillson et al. ................... 384/19 |
| 3,321,855 A * | 5/1967 | Phelps ............................. 40/651 |
| 4,315,661 A * | 2/1982 | Kessler ...................... 312/334.19 |
| 4,620,489 A | 11/1986 | Albano |
| 4,934,645 A | 6/1990 | Breslow |
| 5,484,198 A * | 1/1996 | Pilliod ...................... 312/334.18 |
| 5,720,230 A | 2/1998 | Mansfield |
| 5,799,588 A | 9/1998 | Engel |
| 6,021,908 A | 2/2000 | Mathews |
| 6,497,185 B1 * | 12/2002 | Barrett et al. ................. 108/108 |
| 6,659,293 B1 | 12/2003 | Smith |
| 6,902,244 B1 * | 6/2005 | Chen ........................... 312/334.4 |
| 6,959,507 B2 * | 11/2005 | Bazany et al. .................. 40/312 |
| 6,976,598 B2 | 12/2005 | Engel |
| 7,021,730 B2 * | 4/2006 | Remmers ....................... 312/404 |
| 7,311,211 B2 | 12/2007 | Chung |
| 7,318,532 B1 * | 1/2008 | Lee et al. ........................ 211/26 |

* cited by examiner

*Primary Examiner* — Shin Kim
(74) *Attorney, Agent, or Firm* — Robert C. Montgomery; Montgomery Patent & Design LP

(57) ABSTRACT

A system and method of store sliding shelving that may be selectively extended for restocking and retracted for normal supply and product display. Each sliding shelf includes a slide mechanism that allows each shelf to extend outwardly to enable a store worker to stock or restock the shelf and a concealed locking mechanism with a release lever to allow the sliding shelves to be locked into position. The sliding shelving is beneficially positioned on vertical tracks.

15 Claims, 7 Drawing Sheets

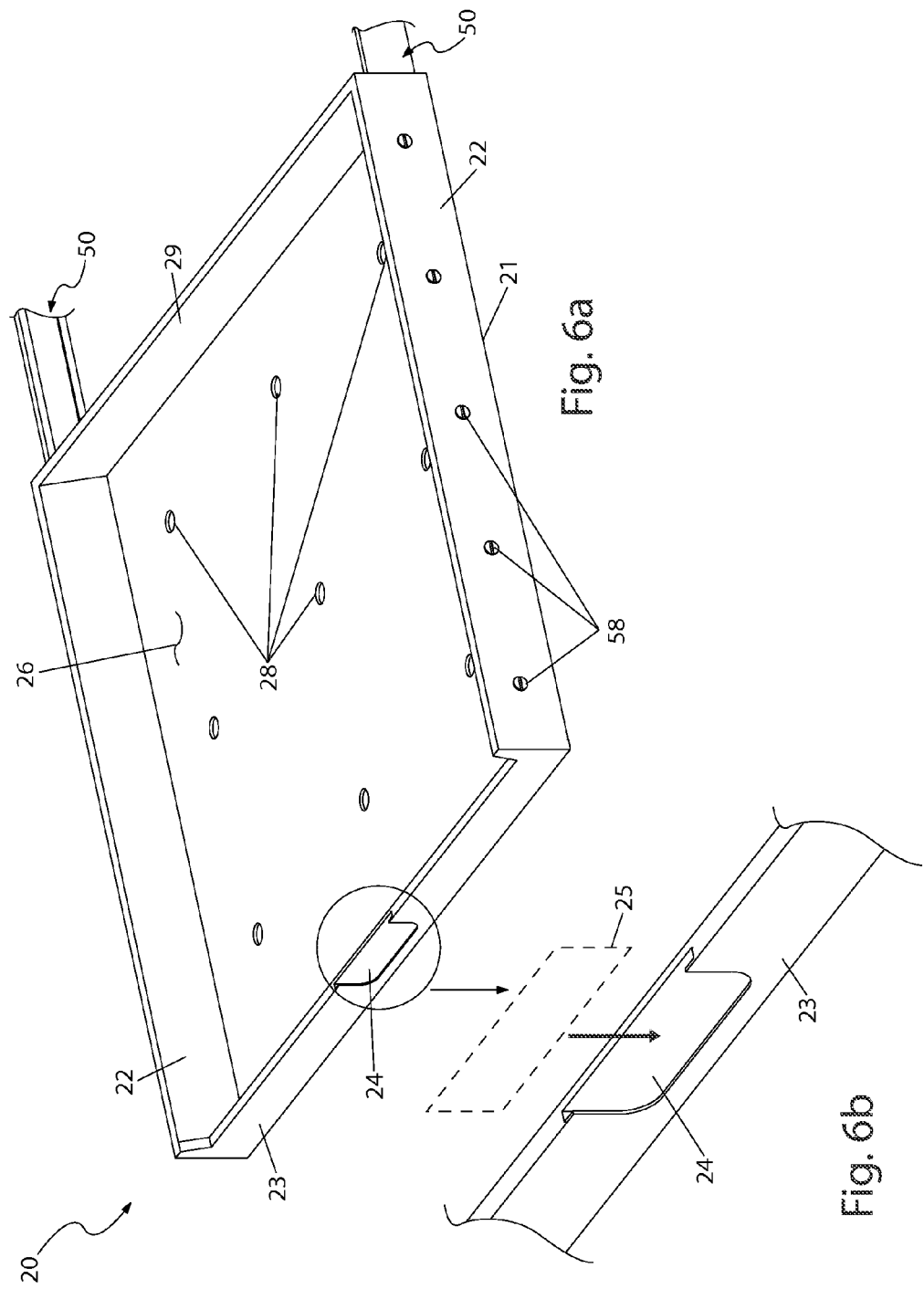

TRACK SHELVING SYSTEM WITH ADJUSTABLE SHELVES

RELATED APPLICATIONS

There are currently no applications co-pending with the present application.

FIELD OF THE INVENTION

The presently disclosed subject matter is directed towards store shelving. More particularly the present invention relates to a shelving system for stocking and displaying store items.

BACKGROUND OF THE INVENTION

One (1) of the last steps in the lengthy process of providing products to consumers is the act of physically placing it on store shelves. While at first glance this is a seemingly simple task, it becomes less so when one realizes the work that must take place. The product must be manually moved forward as sales progress so that the shelves do not look empty. Next, the product must be turned so that the labels are facing forward. Additionally, newer restock product must be placed behind the older product which must be sold first. Finally, all of these actions must take place by turning, stooping, sitting, or standing and then squeezing and threading one's arms through an opening on the shelf to move product. The problems related to stocking shelves exist in grocery stores, discount stores, convenience stores, pharmacies, and almost every location where products are displayed for customer selection.

Stocking shelves can be difficult when performed at chest level, but it becomes even more so when performed at lower levels, especially near the floor. Such locations require the workers to stretch and contort their body into strange shapes simply to reach product on the rear of the lower shelves while working around product on the front. Such stretching can result in muscle strains and joint pains. Accordingly, there exists a need for a shelving system by which the rear areas of store shelves can be easily accessed.

Another problem with stocking shelves is that it can be very time consuming. Rotating stock takes a great deal of time because access to rear stock is impaired by stock in the front. Sometimes the products must be completely removed from the shelves, the formerly front products are reloaded in the rear and older products are reloaded in the front. In a large store such stock rotating can be very time consuming. Additionally, the required repetitive action leads to repetitive stress problems.

Therefore, a new shelving system which enables easy and fast restocking of store shelf products would be beneficial. Even more beneficial would be a shelving system that enables easy and fast restocking of store shelf products that reduce physical discomfort and repetitive stress problems and that is easily retrofit into existing shelving systems.

SUMMARY OF THE INVENTION

The principles of the present invention provide for a shelving system which enables easy and fast restocking of store shelf products in a manner that reduces physical discomfort. It enables shelves that pull forward to allow easy manipulation of product on rear shelves, reduces repetitive stress problems, does not reduce shelf storage capacity, provides a hidden locking system.

A store display tray assembly that is in accord with the present invention includes a tray having a floor and first and second sidewalls disposed along opposing sides. The store display tray also includes at least a first slide assembly having an elongated outer slide channel that is attached to the first sidewall and an elongated inner slide channel that is retained by and in a slideable relationship with the outer slide channel. A friction-reducing slider plate is disposed between the inner slide channel and the outer slide channel.

The floor can have vents, a rear wall, and a front wall. The front wall can include a labeling tag. A locking mechanism can be included. The locking mechanism beneficially includes a torsion spring encompassing an axle that is attached to the inner slide channel. A latching bolt can then pivotally attach to the axel. The latching bolt beneficially includes an end that fits into a slot in the outer slide channel. A handle on the latching bolt can selectively pivot the latching bolt away from the slot. It is useful to have the torsion spring bias the latching bolt toward the slot. The slot should be located toward an end of the first sidewall and it is useful to have the locking mechanism hidden from customers.

The store display tray can be used as part of a store display assembly. To that end, the outer slide channel is attached to the first sidewall and includes a connector bracket with appendages. The first slide assembly attaches to vertical track having a plurality of connector slots by inserting the appendages into a selected connector slot. The store display assembly can further include a wall mount for retaining the vertical track or a floor mount for retaining the vertical track.

BRIEF DESCRIPTION OF THE DRAWINGS

The advantages and features of the present invention will become better understood with reference to the following more detailed description and claims taken in conjunction with the accompanying drawings in which like elements are identified with like symbols and in which:

FIG. 4b is a rear view of the locking mechanism shown in FIG. 4a;

FIG. 6a is a perspective view of a shelf assembly that is used in both the single-aisle and two-aisle shelving systems 10, 15; and, FIG. 6b is a perspective view of a tag holder of each shelf assembly shown in FIG. 6a.

DESCRIPTIVE KEY

Figure 1:
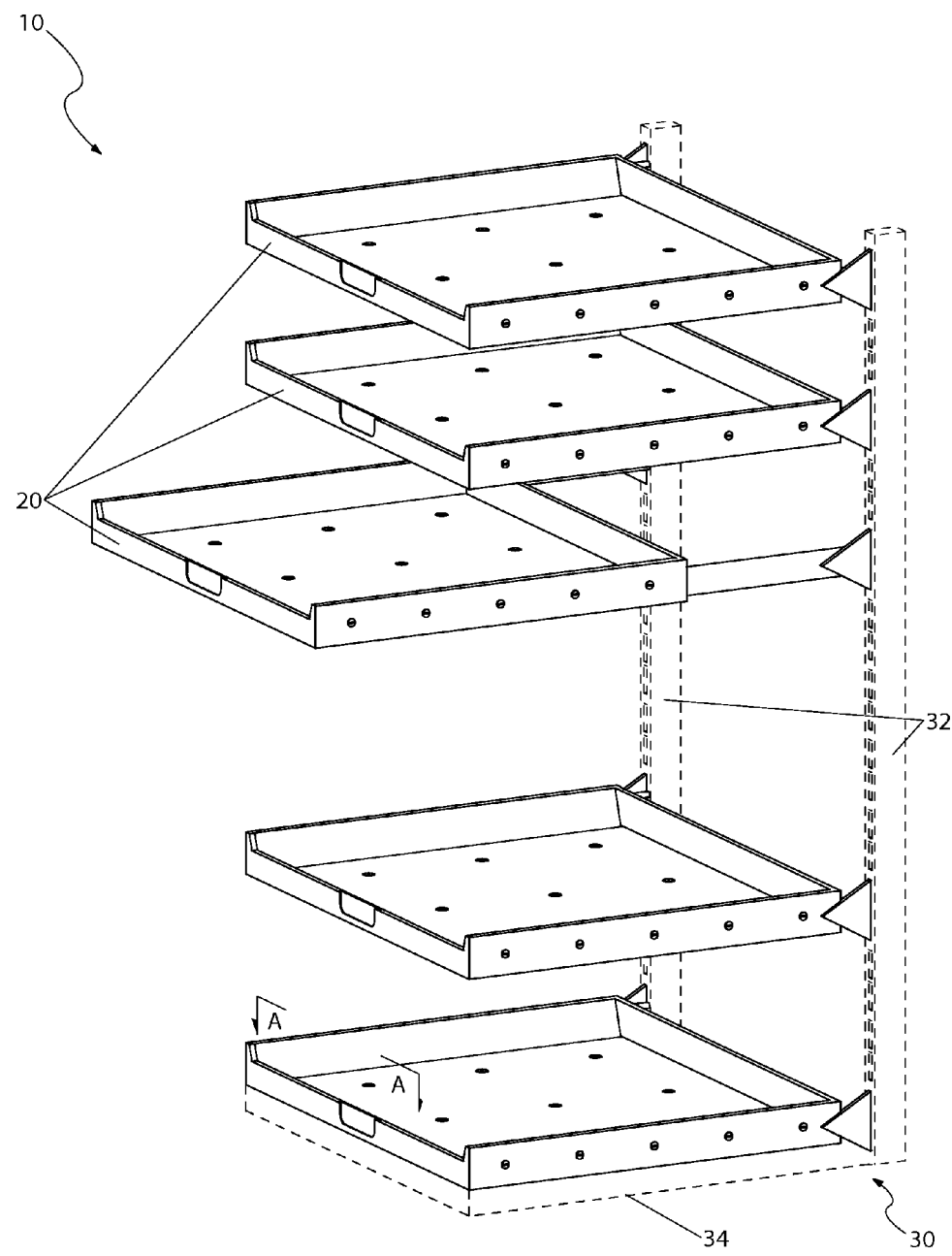
FIG. 1 is a perspective view of a single-aisle track shelving system with sliding shelves that is in accord with the principles of the present invention.

10 single aisle track shelving system with sliding shelves
15 two-aisle track shelving system with sliding shelves
20 shelf assembly
21 tray
22 side wall
23 front wall
24 tag holder
25 tag
26 floor 28 vent
29 rear wall
30 vertical wall-mounted track assembly
32 first vertical track
34 first base
36 connector slot
37 connector bracket
38 first appendage
39 second appendage
40 horizontal floor-mounted track assembly
42 second vertical track
44 second base
50 slide assembly
52 outer slide channel
54 inner slide channel
56 slider plate
58 threaded fastener
60 locking mechanism
62 latching bolt
63 slot
64 actuating handle
66 axle
68 torsion spring

DETAILED DESCRIPTION OF THE PREFERRED EMBODIMENT

The best mode for carrying out the invention is presented in terms of its preferred embodiment, herein depicted within FIGS. 1 through 6b. However, the invention is not limited to the described embodiment, and a person skilled in the art will appreciate that many other embodiments of the invention are possible without deviating from the basic concept of the invention, and that any such work around will also fall under scope of this invention. It is envisioned that other styles and configurations of the present invention can be easily incorporated into the teachings of the present invention, and only one particular configuration shall be shown and described for purposes of clarity and disclosure and not by way of limitation of scope.

The terms "a" and "an" herein do not denote a limitation of quantity, but rather denote the presence of at least one of the referenced items.

Figure 2:
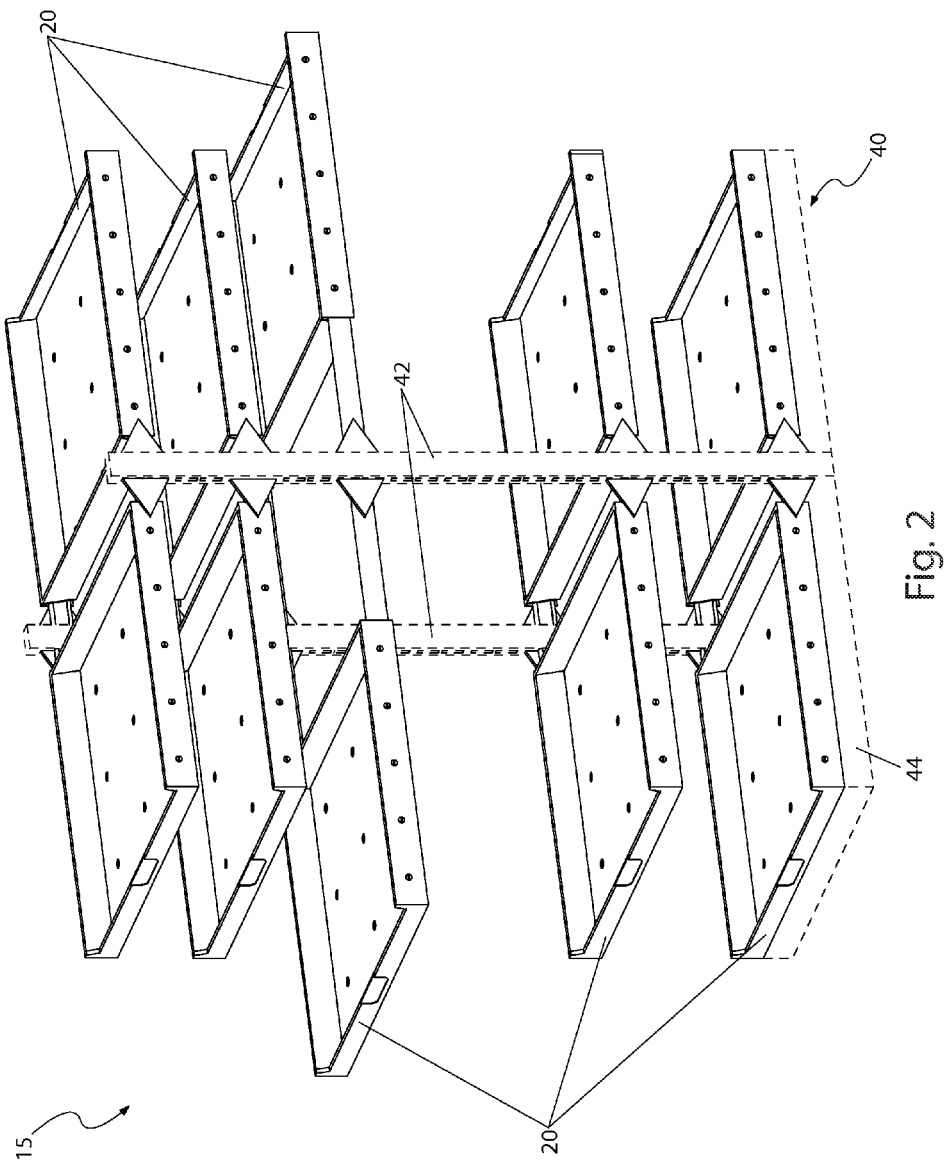
FIG. 2 is a perspective view of a two-aisle (gondola) track shelving system that is also in accord with the principles of the present invention.

Refer now to FIG. 1 for a perspective view of a single-aisle track shelving system with sliding shelves 10 and to FIG. 2 for a perspective view of a two-aisle track shelving system with sliding shelves 15. The single-aisle track shelving system with sliding shelves 10 includes a vertical wall-mounted track assembly 30 comprised of a pair of first vertical tracks 32 supported by a first base 34, while the two-aisle track shelving system with sliding shelves 15 includes a horizontal floor-mounted track assembly 40 having a pair of second vertical tracks 42 supported by a second base 44.

Both embodiments of the track shelving system with sliding shelves use a plurality of outwardly extending and selectively attachable store shelf assemblies 20. Referring now to FIG. 6a, each shelf assembly 20 includes a tray 21 that is capable of being pulled away from the vertical tracks 32, 42 (see FIG. 1 and FIG. 2) for restocking and then pushed back into place to display various store items. The tray 21 provides secure containment of store items during display and is envisioned to have approximate dimensions of thirty (30) to forty-eight (48) inches in width, twelve (12) to twenty-five (25) inches in depth, and one-and-one-half (1½) inches in height. Each shelf assembly 20 further includes a pair of drawer-type slide assemblies 50 that retain the sliding trays 21 to the vertical tracks 32, 42.

Figure 3:
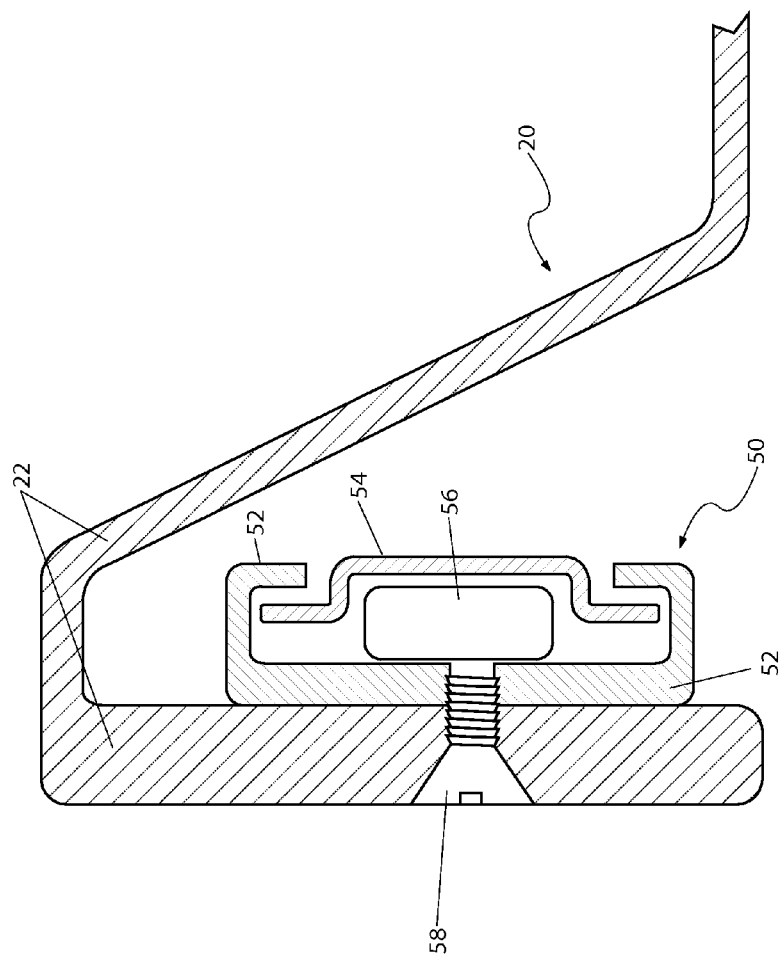
FIG. 3 is a section view taken along section line A-A of FIG. 1 of a slide assembly that is used in both the single-aisle and two-aisle shelving systems 10, 15.
Figure 5:
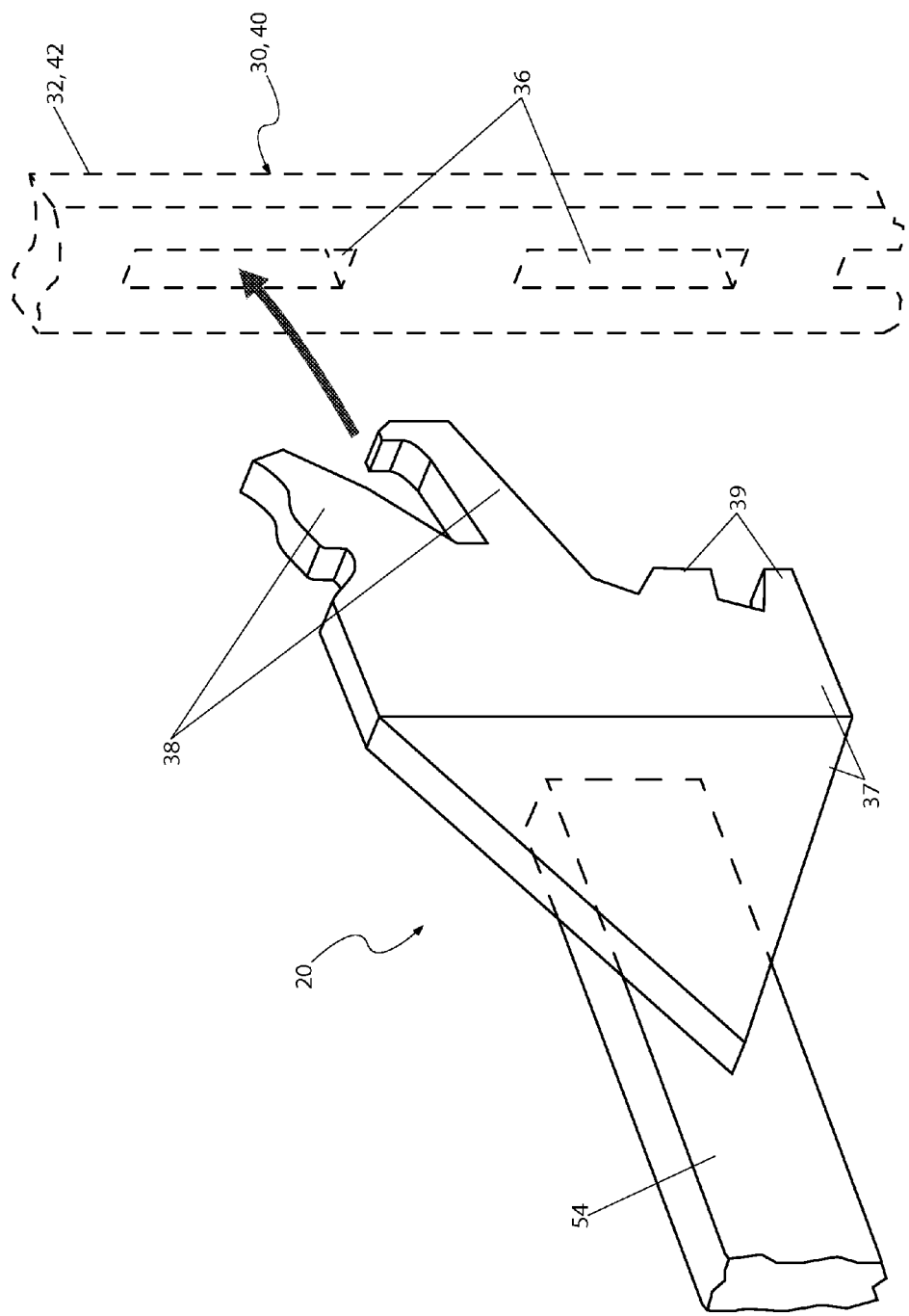
FIG. 5 is a close-up view of a connector bracket that is used in both the single-aisle and two-aisle shelving systems 10, 15.

Referring now primarily to FIG. 3 and FIG. 5, each slide assembly 50 includes an inner slide channel 54 having an integrally attached connector bracket 37. The connector bracket 37 includes a plurality of first appendages 38 and second appendages 39 that engage with connectors slots 36 of the first and second vertical tracks, 32, 42. The first appendages 38 are hook-shaped features that are designed to engage an upper section of the connector slot 36 to secure the shelf assembly 20 horizontally to the vertical track 32, 42. The second appendages 39 are tab-like features that engage the bottom of a connector slot 36 to prevent the shelf assembly 20 from pivoting downwardly, thus securely the shelf assembly 20 horizontally. The connector slots 36 are beneficially equally spaced along the first and second vertical tracks, 32, 42. The connector brackets 37 are beneficially shaped similarly to those used on standardized store shelving units manufactured by companies such as MADIX®, GUANGZHOU GUARD SHELVES CO.®, SHANDONG SUNRISE REFRIGERATOR CO.®, and others.

FIG. 3 shows a section view along section line A-A of FIG. 1. Each shelf assembly 20 provides an attachment to a pair of linear slide assemblies 50. The slide assemblies 50 are affixed to an inner surface of a side wall member 22 of the shelf assembly 20 using a plurality of threaded fasteners 58. This provides a smooth extending and retracting motion. Each slide assembly 50 includes the outer slide channel 52 that captures an inner slide channel 54. A slider plate 56 that acts as a low-friction bearing is inserted between the outer slide channel 52 and the inner slide channel 54.

The slide assembly 50 is beneficially constructed using similar materials as conventional slider designs such as those used in computer rack systems, cabinet drawer designs, and the like. It may also include additional features such as, but not limited to: stop tabs, rollers, bearings, and the like, based upon an anticipated loading scenario.

Figure 4A:
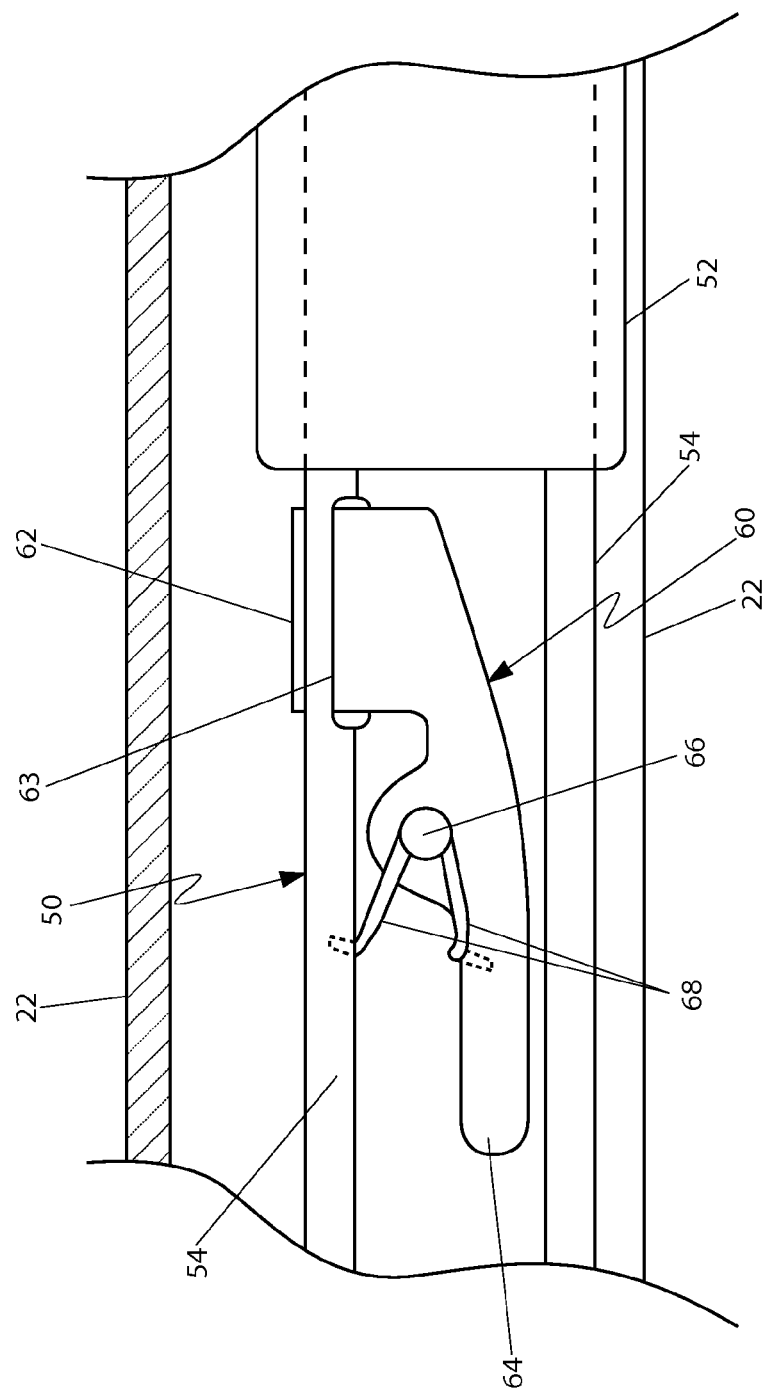
FIG. 4a is a front view of a locking mechanism of the slide assembly shown in FIG. 3.
Figure 4B:
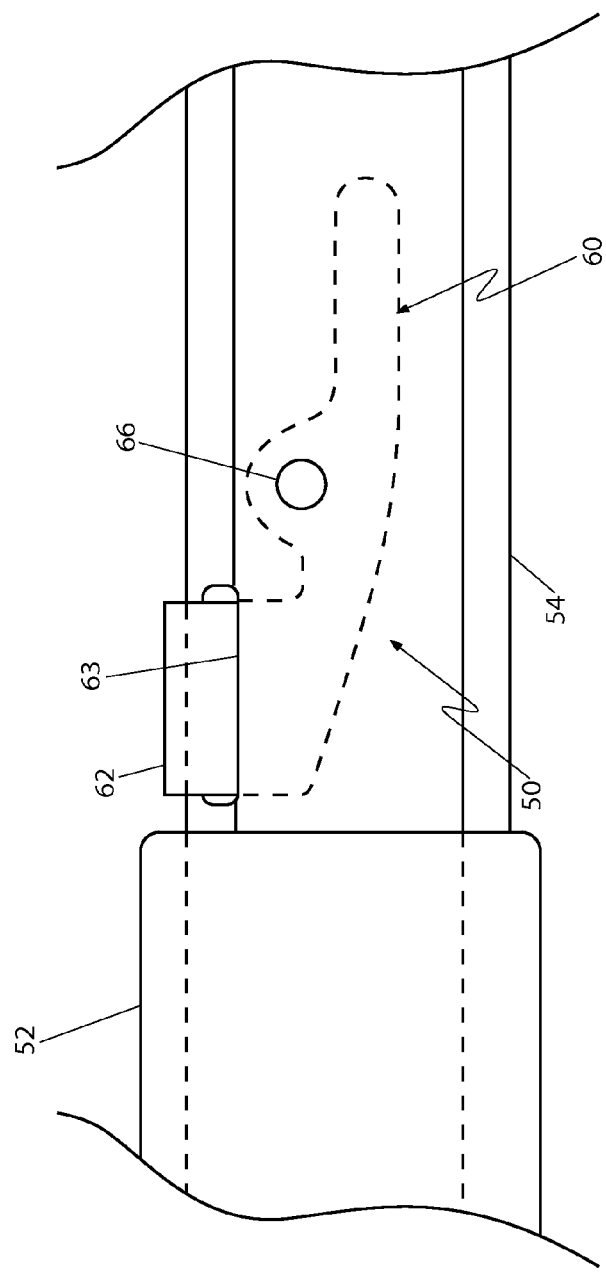

Refer now to FIGS. 4a and 4b, which are front and rear views of a hidden locking mechanism for the slide assembly 50. The locking mechanism secures the slide assembly 50 in an extended position to enable safely stocking the tray 21 and at a retracted position for display of store items in a normal fashion. The locking mechanisms are envisioned as being similar to conventional locking mechanisms used in filing cabinets, computer rack systems, and the like.

Each locking mechanism 60 is pivotally affixed to an inner-facing surface of an inner slide channel 54 via an axle 66. A locking mechanism 60 further includes a latching bolt 62, an actuating handle 64, and a rotary biasing torsion spring 68. The torsion spring 68 encompasses the axle 66 and imparts a rotational bias force on the latching bolt 62. In response to that bias, the latching bolt 62 upwardly pivots toward mating slots 63 that pass through the inner slide channel 54 at corresponding extended and retracted positions of the shelf assembly 20. This enables the bolt 62 to slide into the slots 63 and subsequently engage with the outer slide channel 52 to secure the tray 21 in an extended or retracted position.

Referring once again to FIG. 6a, each shelf assembly 20 includes a unitary tray 21 for holding store items. The tray 21 is beneficially made from a strong metal or plastic platform. It includes two (2) side walls 22, a front wall 23, and a rear wall 29 that act together to retain store items on the tray 21. The various walls 22, 29 are preferably hollow and are approximately one and one-half (1½) inches high. The front wall 23 is lower, approximately three-quarters (¾) of an inch in height. At the bottom of the tray 21 is a floor 26. The side walls 22 enable attachment of the previously described slide assemblies 50 (see FIG. 3).

Referring now to both FIGS. 6a and 6b, the front wall 23 beneficially includes a tag holder 24, typically in the form of an open-top slot holder designed to receive and retain a standard tag 25. The floor 26 can include a plurality of vents 28 to provide air circulation through the shelf assembly 20. The vents 28 are envisioned as being punched or drilled round or ovular openings arranged along equally-spaced rows and columns.

The wall-mounted track assemblies 30 and the floor-mounted track assemblies 40 provide numerous slots for attaching a number of shelf assemblies 20 at independently selectable heights based upon a user's preference. The wall-mounted track assemblies 30 and the floor-mounted track assemblies 40 are envisioned as being similar to or identical with commonly used standardized designs supplied by companies such as MADIX®, GUANGZHOU GUARD SHELVES CO.®, SHANDONG SUNRISE REFRIGERATOR CO.®, and others. Additionally, while supplying shelf assemblies 20 with wall-mounted track assemblies 30, and/or with floor-mounted track assemblies 40 is useful, the shelf assemblies 20 can also be used in retrofits into existing track assemblies.

It is envisioned that other styles and configurations of the present invention can be easily incorporated into the teachings of the present invention, and only one particular configuration shall be shown and described for purposes of clarity and disclosure and not by way of limitation of scope.

The preferred embodiments of the present invention can be utilized by the common user in a simple and effortless manner with little or no training. After initial purchase or acquisition of either the single-aisle track shelving system with sliding shelves 10 or the two-aisle track shelving system with sliding shelves 15 it would be installed as indicated in either FIG. 1 or FIG. 2.

The method of installing and utilizing either the single-aisle track shelving system with sliding shelves 10 or the two-aisle track shelving system with sliding shelves 15 is achieved by performing the following steps: procuring either single-aisle track shelving system with sliding shelves 10 or the two-aisle track shelving system with sliding shelves 15, installing vertical tracks 32, 42 having a desired height; installing a particularly sized base unit 34, 44; procuring a desired number of shelf assemblies 20 having desired width and depth dimensions; assembling the vertical tracks 32, 42 and base units 34, 44 to form either a vertical wall-mounted track assembly 30 or a horizontal floor mounted track assembly 40; affixing a desired number of shelf assemblies 20 at desired heights and desired spacing by locking integral connector brackets 37 into the corresponding connector slots 36 of the track assemblies 32, 42; accessing the floor 26 of a tray 21 by pressing the handle 64 of the locking mechanism 60 upwardly to disengage the latching bolt 62 from the slot 63 located at the retracted position along the inner slide channel 54; pulling the tray 21 outward until the latching bolt 62 engages the slot 63 located at the extended position along the inner slide channel 54; gaining access to the floor 26 of the shelf assembly 20; loading a desired type and amount of store items onto the floor 26; returning the tray 21 to its retracted position in like manner using the handle 64 until the latching bolt 62 engages the slot 63 at the recessed position; and repeating the extending, loading, and retracting process for subsequent shelf assemblies 20.

The foregoing descriptions of specific embodiments of the present invention have been presented for purposes of illustration and description. They are not intended to be exhaustive or to limit the invention and method of use to the precise forms disclosed. Obviously many modifications and variations are possible in light of the above teaching. The embodiment was chosen and described in order to best explain the principles of the invention and its practical application, and to thereby enable others skilled in the art to best utilize the invention and various embodiments with various modifications as are suited to the particular use contemplated. It is understood that various omissions or substitutions of equivalents are contemplated as circumstance may suggest or render expedient, but is intended to cover the application or implementation without departing from the spirit or scope of the claims of the present invention.

What is claimed is:

1. A store display tray assembly, comprising:
   a tray having a floor and first and second sidewalls disposed along opposing sides, said tray for retaining and displaying store products;
   a first slide assembly having an elongated outer slide channel attached to said first sidewall and having an elongated slot, an elongated inner slide channel retained by and in a slideable relationship with said outer slide channel and having an axle, and a friction-reducing slider plate disposed between said inner slide channel and said outer slide channel; and,
   a locking mechanism having a torsion spring encompassing said axle and a latching bolt pivotally attached to said axle, said latching bolt having an end that fits into said slot and a handle for pivoting the latching bolt to move the latching bolt away from said slot, wherein said torsion spring biases said latching bolt toward said slot.

2. The store display according to claim 1, wherein said slot is located toward an end of said first sidewall.

3. The store display according to claim 1, wherein said locking mechanism is hidden from customers.

4. The store display according to claim 1, wherein said floor includes vents.

5. A store display according to claim 1, wherein said tray includes a rear wall.

6. A store display according to claim 1, wherein said tray further includes a front wall.

7. A store display according to claim 6, wherein said front wall includes a tag.

8. A store display assembly, comprising:
   a tray having a floor and first and second sidewalls disposed along opposing sides, said tray for retaining and displaying store products;
   a first slide assembly having an elongated outer slide channel attached to said first sidewall and having an elongated lock slot and a connector bracket with appendages at one end, an elongated inner slide channel retained by and in slideable relationship with said outer slide channel and having an axle, and a friction-reducing slider plate disposed between said inner slide channel and said outer slide channel;
   a locking mechanism having a torsion spring encompassing said axle and a latching bolt pivotally attached to said axle, said latching bolt having an end that fits into said slot and a handle for pivoting the latching bolt to move the latching bolt away from said slot, wherein said torsion spring biases said latching bolt toward said slot; and,
   a vertical track having a plurality of connector slots dimensioned to receive said appendages;
   wherein said first slide assembly attaches to said vertical track by inserting appendages into a first connector slot of said plurality of connector slots.

9. The store display assembly according to claim 8, further including a wall mount retaining said vertical track.

10. The store display assembly according to claim 8, further including a floor mount retaining said vertical track.

11. The store display assembly according to claim 8, wherein said lock slot is located toward an end of said first sidewall.

12. The store display assembly according to claim 8, wherein said locking mechanism is hidden from customers.

13. The store display assembly according to claim 8, wherein said floor includes vents.

14. The store display assembly according to claim 8, wherein said tray includes front wall.

15. The store display assembly according to claim 14, wherein said front wall includes a tag.

\* \* \* \* \*